United States Patent

Fukui et al.

Patent Number: 5,705,226
Date of Patent: Jan. 6, 1998

[54] FORMATION OF MAGNESIUM VAPOR WITH HIGH EVAPORATION SPEED

[75] Inventors: Yasushi Fukui; Tadaaki Miono; Minoru Saito, all of Sakai, Japan

[73] Assignee: Nisshin Steel Co., Ltd., Tokyo, Japan

[21] Appl. No.: 622,822

[22] Filed: Mar. 27, 1996

[30] Foreign Application Priority Data

Mar. 28, 1995 [JP] Japan ............................. 7-094333

[51] Int. Cl.$^6$ ........................................... C23C 16/06
[52] U.S. Cl. ........................ 427/250; 427/251; 427/294; 427/295
[58] Field of Search ........................... 427/250, 251, 427/294, 295; 118/726

[56] References Cited

U.S. PATENT DOCUMENTS

| | | | |
|---|---|---|---|
| 2,793,609 | 5/1957 | Tzu en Shen et al. | 118/49 |
| 2,996,418 | 8/1961 | Bleil | 154/95 |
| 3,637,421 | 1/1972 | Gimigliano | 117/107 |

FOREIGN PATENT DOCUMENTS

| | | |
|---|---|---|
| 2125866 | 5/1990 | Japan. |
| 2307822 | 12/1990 | Japan. |
| 0892734 | 4/1996 | Japan. |
| 8165562 | 6/1996 | Japan. |

*Primary Examiner*—Shrive Beck
*Assistant Examiner*—Timothy Meeks
*Attorney, Agent, or Firm*—Webb Ziesenheim Bruening Logsdon Orkin & Hanson, P.C.

[57] ABSTRACT

A Mg source 3 is received in a vessel 1 having an opening 8, and the vessel 1 is heated at 670° C. or higher to effuse Mg vapor through the opening 8. Since the vessel 1 is filled with Mg vapor, Mg is evaporated from molten state under stable condition without fluctuations in evaporation speed. The Mg vapor is effectively consumed for vapor deposition. A reflector plate may be provided at the outlet of the opening 8, or a duct for introducing Mg vapor from the vessel to the surface of a substrate sheet may be provided. In order to evaporate Mg from stabilized molten state, operational conditions are preferably determined so as to satisfy the relationships of $W_1/W_2 < 0.6 \times (P_{Mg}/V^3)$ and $W_1/W_2 < 0.04 \times P_{Mg}$, wherein $W_1$ represents the area (mm$^2$) of the opening 8, $W_2$ represents the evaporation surface area (mm$^2$) of the Mg source 3, $P_{Mg}$ represents Mg vapor pressure (torr.) and V represents the degree of vacuum.

2 Claims, 4 Drawing Sheets

AT DEGREE OF VACUME : $1 \times 10^{-5}$ torr

AT $N_2$ PARTIAL PRESSURE OF $1 \times 10^{-4}$ torr

000
FORMATION OF MAGNESIUM VAPOR WITH HIGH EVAPORATION SPEED

BACKGROUND OF THE INVENTION

The present invention relates to a method of evaporating magnesium which is volatile in a vacuum atmosphere for use in vapor Mg deposition or the like.

A Mg source has been evaporated so far using heating means such as an electric heater or electron beam which has been used for the evaporation of unvolatile metals such as Al or Cu. For instance, in the case of evaporation in small amounts, a Mg source is put on a boat made of Mo or W, and the boat is resistance heated to evaporate Mg. In the case of evaporation in large amounts, a Mg source is put in a crucible, and the crucible is heated by an electric heater or electron beam.

Mg is a metal which is volatile in a vacuum atmosphere. Due to this property, Mg is sublimated from a solid state without passing through a liquid state. Therefore, the Mg source changes its shape in the solid state with the lapse of time when it is heated on the boat or in the crucible. This shape changing means a change of surface area and a change of evaporation speed. The evaporation is abruptly changed and difficult to control. Even when the temperature of the boat or crucible is controlled by adjusting the output power of the electric heater or electron beam, the temperature control can not follow the abrupt changing of the evaporation speed.

In order to control the thickness of a vapor deposition film and/or the speed of vapor deposition with high accuracy, the evaporation speed of Mg can be kept at a constant value or controlled properly by a sputtering process. However, the sputtering process is inferior in productivity, since Mg is evaporated at a slow speed. In addition, the efficiency of input energy consumed for the evaporation is very low in the sputtering process. For instance, the ratio of input energy consumed for the evaporation is only 10% or lower. If Mg can be evaporated from a liquid phase, the evaporation at a high speed under constant conditions would be estimated.

In the case of materials such as Al or Cu which are evaporated from a liquid state, the evaporation source is melted on the way. Due to this molten state, an evaporation surface is kept constant by the inner face of a vessel such as a crucible. Consequently, the evaporation speed can be controlled at a constant level or properly changed with high accuracy, by adjusting the output power of an electric heater or electron beam so as to hold the vessel at a predetermined temperature. If such a evaporation condition were applicable for Mg evaporation, Mg could be evaporated at a high speed and with high accuracy.

SUMMARY OF THE INVENTION

The present invention is accomplished to overcome the problems afore-mentioned.

One object of the present invention is to control the evaporation amount of Mg with high accuracy by effusing Mg vapor through the opening of a vessel filled with Mg vapor.

Another object of the present invention is to evaporate Mg in controlled amounts under stabilized conditions without splashing by controlling the opening ratio of the opening in relation with operational conditions such as Mg vapor pressure, the degree of vacuum and evaporation surface area in an evaporation vessel.

According to the present invention, a Mg source is received in a vessel having an opening, said vessel is heated to a temperature of 670° C. or higher, and formed Mg vapor is effused through said opening. Since the vessel is filled with Mg vapor at a pressure high enough to hold the Mg source in a molten state, the efflux of Mg vapor from the vessel can be easily controlled with high accuracy.

A reflector plate may be provided at the outlet of the opening. When the reflector plated is heated to 500° C. or higher, the evaporation amount of Mg is controlled with much higher accuracy.

A duct may be provided in the state extending from the outlet of the vessel to the position where a substrate sheet is located, for introducing Mg vapor to the substrate sheet.

The Mg evaporation is preferably performed under the conditions satisfying the relationships of $W_1/W_2 < 0.6 \times (P_{Mg}/V^3)$ and $W_1/W_2 < 0.04 \times P_{Mg}$, wherein $W_1$ represents the opening area (mm$^2$) of an evaporation cell, $W_2$ represents the evaporation area in the evaporation cell, $P_{Mg}$ represents Mg vapor pressure (torr.), and V represents the degree of vacuum (torr.). The Mg source in the cell is preferably heated at a temperature of 770° C. or lower.

DETAILED DESCRIPTION OF THE PREFERRED EMBODIMENTS

According to the present invention, a Mg source is received in a vessel having an opening, and the vessel is heated to 670° C. or higher. The Mg source is evaporated by said heating and the vessel is filled with formed Mg vapor so that the internal pressure of the vessel is held at the same level, but not lower than, the Mg vapor pressure. This internal pressure assures the presence of a thick gaseous layer having the same pressure as Mg vapor pressure above the surface of the Mg source and suppresses sublimation even in a vacuum atmosphere. Consequently, Mg can be evaporated from the molten state. A high-pressure gaseous layer of 1 mm or more in thickness seems to be necessary in order to hold the Mg source in a stable molten state. Since Mg is evaporated from the molten state, the evaporation is continued at a constant speed under stabilized condition.

Figure 1:
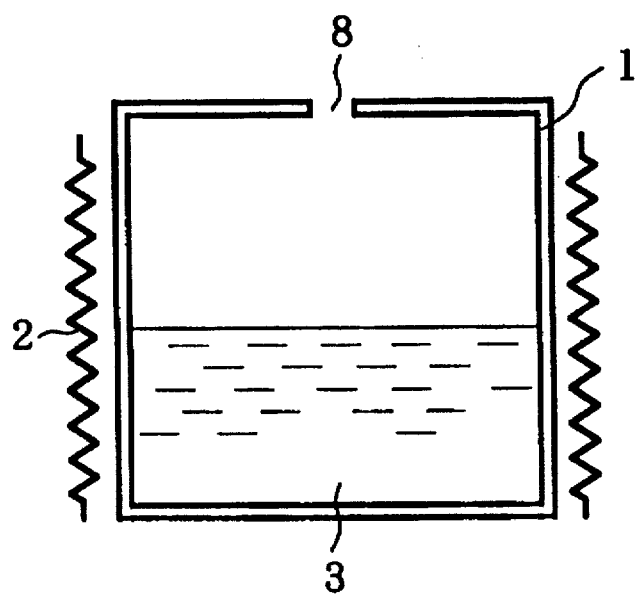
FIG. 1 is a sectional view of a vessel used for Mg evaporation according to the present invention.

FIG. 1 shows a Mg source 3 received in a vessel 1 having an opening 8. When the vessel 1 is heated to 670° C. or higher by a heater 2, the vessel 1 is filled with formed Mg vapor until the internal pressure of the vessel 1 reaches the Mg vapor pressure. As a result, sublimation is suppressed, even in a vacuum atmosphere, and the Mg source 3 is held in a molten state.

Mg vapor pressure is approximately 7 torr. at 700° C. The vessel 1 is substantially filled with Mg vapor during the Mg evaporation, even when there are other gasses in the vessel 1.

The opening 8 is properly determined in dimensions under the condition that the internal pressure of the vessel 1 is nearly equal to the Mg vapor pressure. The opening 8 may have a circular or slitted shape. The opening 8 may be provided at any position, i.e. not only at the upper part of the vessel but also at the side, as long as the opening 8 is located at a level higher than the surface of the molten Mg source 3.

The Mg source 3 in the vessel 1 is held at a temperature of 670° C. or higher in order to inhibit solidification, which decelerates the Mg evaporation due to the fluctuation of temperature.

There are no restrictions on the degree of vacuum in the vessel. When Mg is evaporated in a decompressed gas atmosphere, inert gas is used and the pressure of said inert gas is held lower than the Mg vapor pressure. If gas active with Mg is used, the gas flowing into the vessel 1 would react with the Mg source 3 and form compound films as reaction products on the surface of the Mg source 3, even when the amount of the gas flowing into the vessel 1 is very small. Such compound films often impede the Mg evaporation. If the pressure of the inert gas exceeds the Mg vapor pressure, Mg vapor would not be effused through the opening 8.

When Mg vapor is effused from the vessel 1 through the opening 8 to the outside, Mg vapor is adiabatically expanded since the outside is in the vacuum or decompressed atmosphere. This adiabatic expansion causes a temperature decrease of the Mg vapor and the bonding of Mg vapor, i.e. the formation of clusters. The formation of clusters is promoted as the increase of Mg vapor effused through the opening 8. The clusters sometimes grow up to 100 μm or more in size and put harmful influences on the formation of a vapor deposition film of a few μm in thickness.

Figure 2:
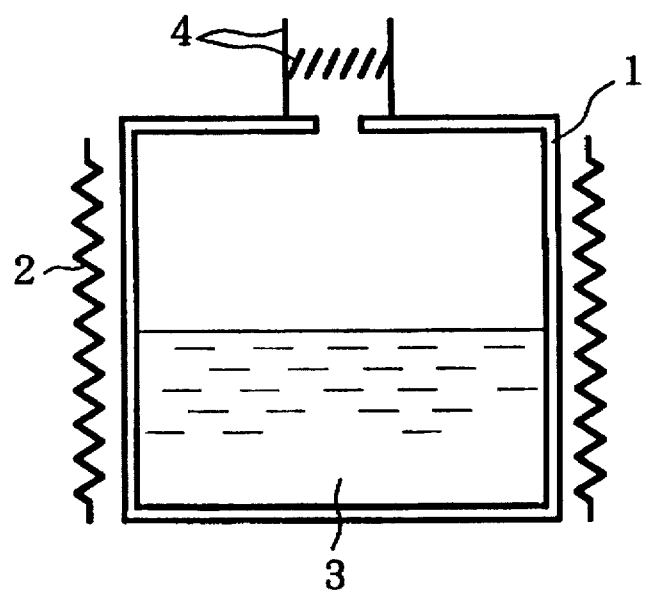
FIG. 2 is a sectional view of a vessel having a reflector plate.

When the vessel 1 is over-heated, the molten Mg source 3 is likely to bump and splash. Some of splashes are a few μm in size. If such splashes pass through the opening 8 and reach a substrate sheet, significant defects would be formed in a vapor deposition film. Such clusters or splashes are smashed against a heated reflector plate 4 provided at the outlet of the opening 8, as shown in FIG. 2. The clusters or splashes are heated again on the reflector plate 4 and re-evaporated to atomic vapor by the collision. As a result, it is possible to inhibit the formation of defects in the vapor deposition film caused by the clusters or splashes.

The reflector plate 4 may be made of carbon or steel. The reflector plate 4 may have any configuration which does not permit the flowing of clusters or splashes. The reflector plate 4 is preferably heated to 500° C. or higher in order to re-evaporate all Mg deposited on it without accumulation.

Figure 3:
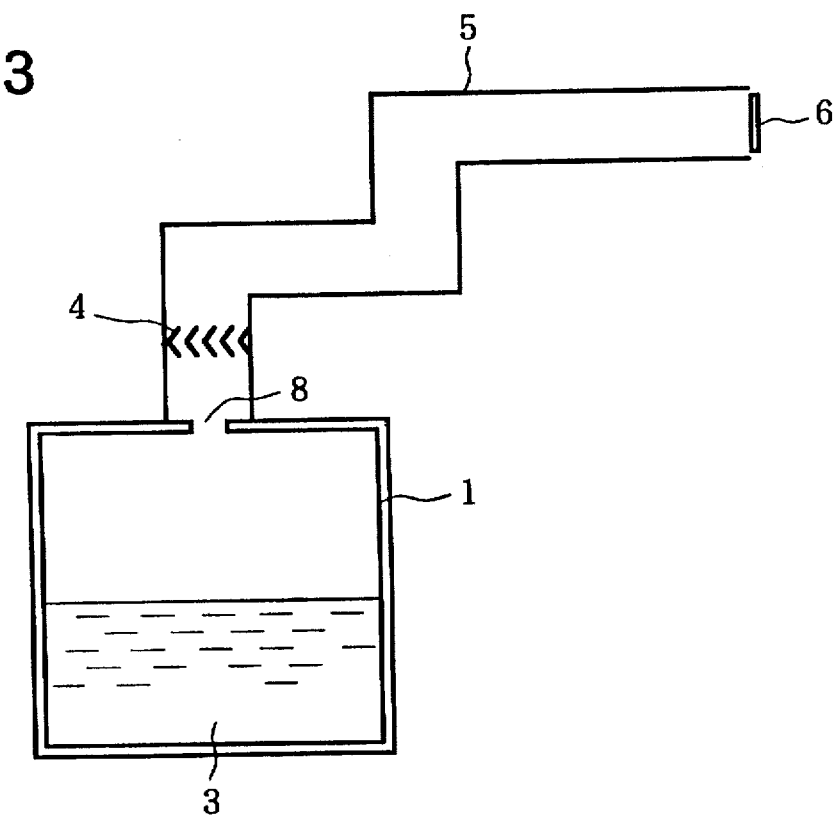
FIG. 3 is a sectional view of a vessel having a duct for directing Mg vapor to a substrate sheet.
Figure 4:
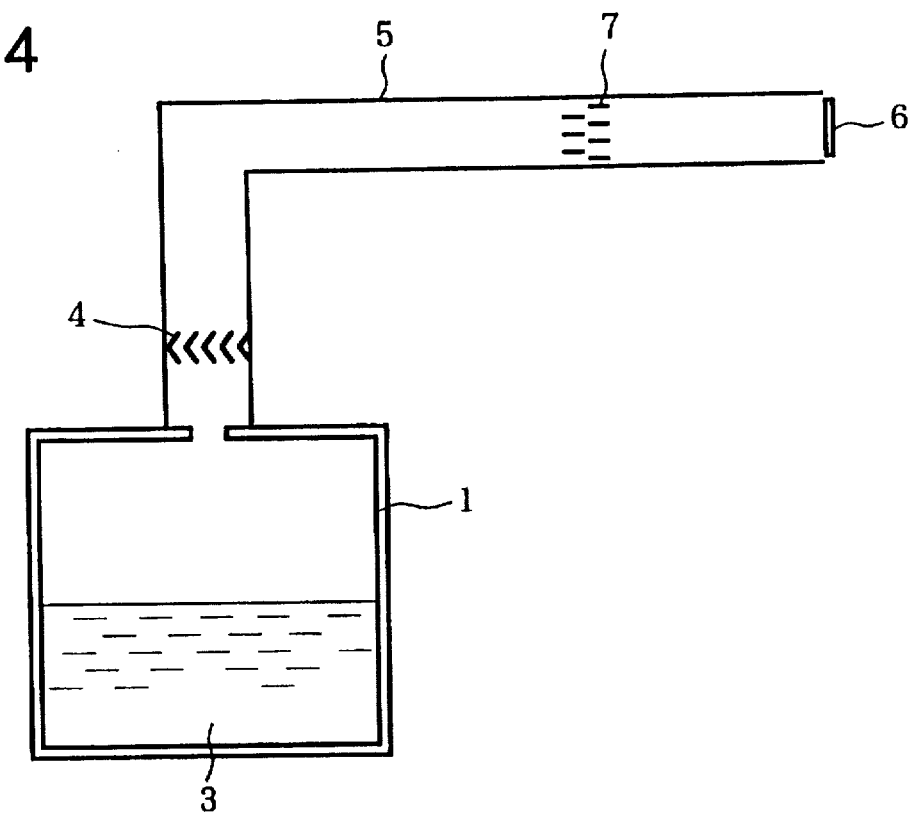
FIG. 4 is a sectional view of a vessel having the duct in which a current plate is disposed for making vapor deposition uniform.

A duct 5 for directing Mg vapor to a substrate sheet 6 may be provided in the space extending from the outlet of the opening 8 to the position where the substrate sheet 6 is located, as shown in FIG. 3. Conventional heating means may be attached to the duct 5. When the duct 5 is heated to 500° C. or higher, the inner wall of the duct 5 is protected from Mg vapor deposition and its accumulation. The duct 5 has the same effect as the reflector plate 4 for eliminating clusters or splashes. However, when the duct 5 has a large sectional area with respect to its length, some clusters and splashes may pass through the duct 5 to the substrate sheet 6. In this case, another reflector plate, similar to the reflector plate 4 shown in FIG. 2, is additionally provided in the duct to inhibit the passing of clusters or splashes. A current plate 7 may be provided in the duct 5, as shown in FIG. 4, to make vapor Mg deposition uniform on the substrate sheet 6.

When $H_2O$ or $O_2$ remains in the vacuum atmosphere for Mg evaporation, $H_2O$ or $O_2$ invades through the opening 8 into the vessel 1 and reacts with the highly-active Mg to form films of oxide or other reaction products on the surface of the Mg source 3. Such films decelerate Mg evaporation. Especially, $H_2O$ in large amounts is adsorbed on the wall of the vacuum chamber when the vacuum chamber is released to the open atmosphere. After the chamber is evacuated to a vacuum atmosphere, the adsorbed $H_2O$ is slowly desorbed from the wall surface, but the desorption of $H_2O$ from the wall surface to the vacuum atmosphere continues for a long time. Consequently, $H_2O$ naturally exists in the atmosphere at any degree of vacuum and causes the formation of the oxide films on the surface of Mg source 3. A nitride would act as a harmful reaction product. The nitride is formed by the reaction between highly-reactive Mg and relatively inactive $N_2$ remaining in large amounts in the vacuum atmosphere.

The films of oxide or other reaction products formed on the surface of the Mg source 3 also promotes the splashing of the Mg source 3. Even when there are neither oxides nor reaction products on the surface of the Mg source 3, bubbles are formed in the molten Mg source 3 heated at a higher temperature. The bubbles go up and erupt on the surface of the molten Mg source 3. The eruption causes splashing of the Mg source 3, so as to fluctuate the evaporation speed and to make the control of vapor deposition difficult.

Figure 5:
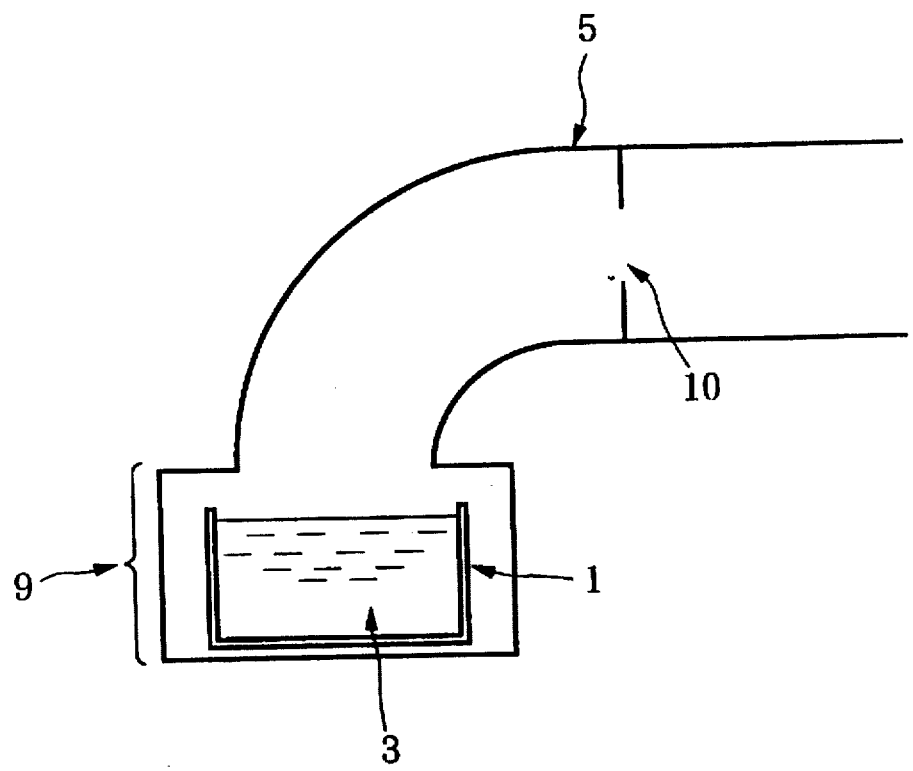
FIG. 5 is a sectional view of a vessel having the duct in which an opening is formed.

The suppression of such splashes for stabilized Mg evaporation is assured by using a vessel 1 having a small opening 8 as shown in FIG. 1. The harmful influence of the splashing may be inhibited by an additional opening 10 provided at the middle of the duct 5 connected to the evaporation chamber 9 wherein the vessel 1 is located, as shown in FIG. 5, too.

Figure 6:
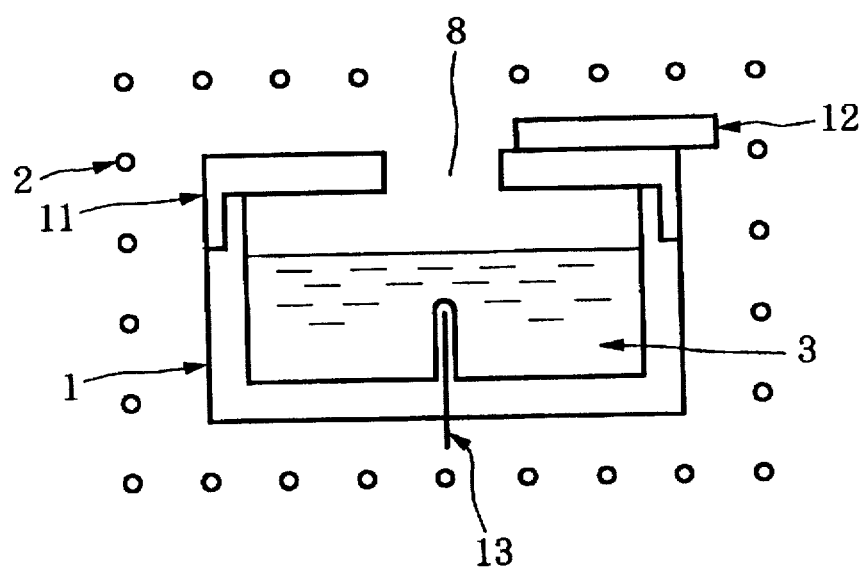
FIG. 6 is a sectional view of a vessel having a shutter which controls the opening ratio of the opening.

The evaporation from the molten Mg source 3 may be quantitatively controlled by a shutter 12 attached to an upper wall 11 defining the opening 8, as shown in FIG. 6. In this case, a temperature sensor 13 is inserted through a proper hole into the evaporation chamber 9 and embedded in the wall of the vessel 1. The temperature of the molten Mg source 3 is detected by the sensor 13, and the detected value is used for controlling the input power to be applied to the heater 2. Since the hole for the insertion of the sensor 13 is formed in the chamber 9, the opening area of the insertion hole is included in the total opening area for the calculation to determine the conditions satisfying the relationships above-mentioned.

When the opening 8 of the evaporation vessel 1 is small compared with the surface area of Mg evaporation in the vessel 1, Mg vapor in the vessel 1 is held at a high pressure. The high pressure assures the effusion of Mg vapor in large amounts at high speed through the opening 8 and inhibits the invasion of gasses from the atmosphere into the vessel 1. Since the Mg vapor pressure in the vessel 1 becomes bigger as the temperature of the Mg source increases, the same effect is obtained by heating the Mg source.

When the interior of the cell 3 is held at a high degree of vacuum, the pressure difference between the outside and inside of the vessel 1 becomes bigger, so that Mg vapor is effused at high speed through the opening 8 while inhibiting the invasion of atmospheric gasses.

As afore-said, the area ratio of the opening 8 to the surface of Mg evaporation in the vessel 1, Mg vapor pressure and the degree of vacuum have mutual relationships and put influences on Mg evaporation. According to our researches and examinations, the condition of $W_1/W_2<0.6\times(P_{Mg}/V^3)$ is effective for inhibiting the invasion of atmospheric gas and for inhibiting the formation of oxide films or other reaction product films on the surface of the molten Mg source 3. Consequently, Mg is evaporated at a constant speed with high accuracy.

Since there are neither oxide films nor other reaction product films, splashing is inhibited and the deviation of evaporation speed is suppressed. Consequently, Mg deposition is performed with uniform thickness, even when Mg is vapor deposited on a long substrate such as steel sheet or coil.

When the shutter 6 is abruptly closed, the opening 8 is made smaller according to $W_1/W_2<0.04\times P_{Mg}$ so as to inhibit the reduction of inner pressure in the vessel 1, otherwise Mg would be solidified. The condition of $W_1/W_2<0.04\times P_{Mg}$ is effective for holding the inner pressure in the vessel 1 above a predetermined value so as not to solidify Mg, even when the inner pressure in the vessel 1 is likely to be reduced by changing operational conditions such as the reduction of the degree of vacuum, too. In addition, since the interior of the vessel 1 is held above a predetermined pressure, the formation of splashes is inhibited.

The formation of bubbles in the molten Mg source 3 is inhibited by holding the molten Mg source 3 at a temperature of 770° C. or lower. As a result, Mg evaporation is continued under stable conditions without the formation of splashes. The solidification of Mg is inhibited regardless of a small deviation in temperature, by holding the molten Mg source 3 at a temperature of 670° C. or higher, so as to evaporate Mg under stable conditions.

When the conditions for evaporation are controlled according to the present invention as afore-mentioned, Mg evaporation is stabilized while inhibiting the formation of oxide films on the surface of the molten Mg source 3 and the formation of splashes. Consequently, Mg is evaporated from the molten state as such under stable condition regardless of the opening or closing motion of the shutter 12.

EXAMPLE

Example 1

A graphite crucible of 70 mm in inner diameter, 110 mm in depth and 8 mm in thickness was used as a vessel for Mg evaporation. The crucible has the configuration shown in FIG. 1 with an opening of 6 mm in diameter. The crucible was preset in a vacuum chamber held in a vacuum atmosphere at $1\times10^{-5}$ torr. or in a decompressed $N_2$ atmosphere at $1\times10^{-1}$ torr., and heated to 720° C. to evaporate Mg. Said decompressed $N_2$ atmosphere was prepared by evacuating the vacuum chamber to the degree of vacuum $1\times10^{-5}$ torr. and then supplying $N_2$ gas up to the predetermined pressure.

The opening of the crucible was closed with a shutter at the beginning. When the crucible reached 720° C., the opening was released. Mg was vapor deposited on a substrate sheet provided at a position 200 mm higher than the crucible. The evaporation speed was researched with the lapse of time in this state. The results are shown in FIGS. 7 and 8, respectively, for the evaporation in the vacuum atmosphere and in the decompressed $N_2$ atmosphere.

Figure 7:
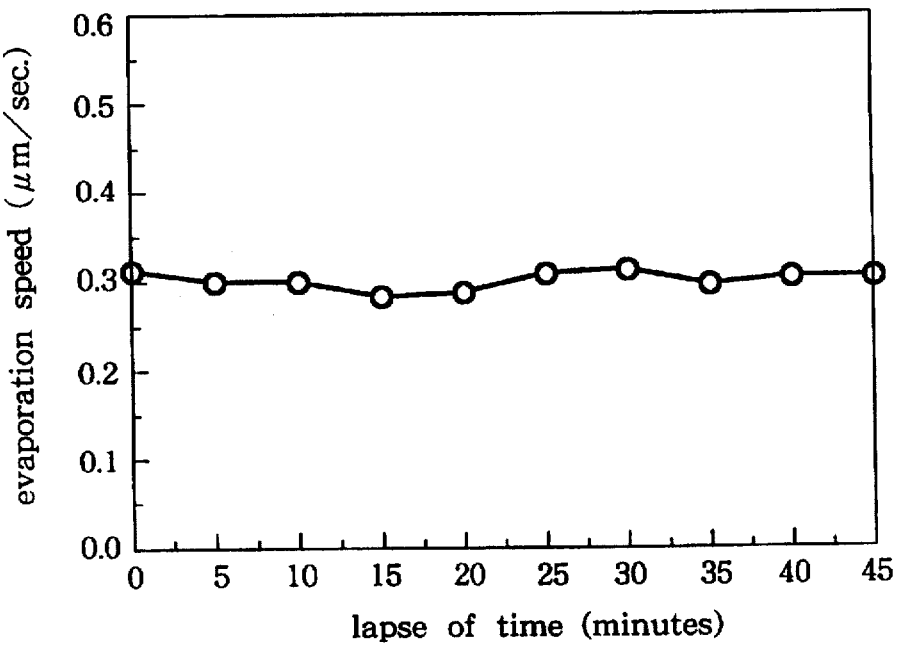
FIG. 7 is a graph showing the change of evaporation speed with the lapse of time in a vacuum atmosphere.
Figure 8:
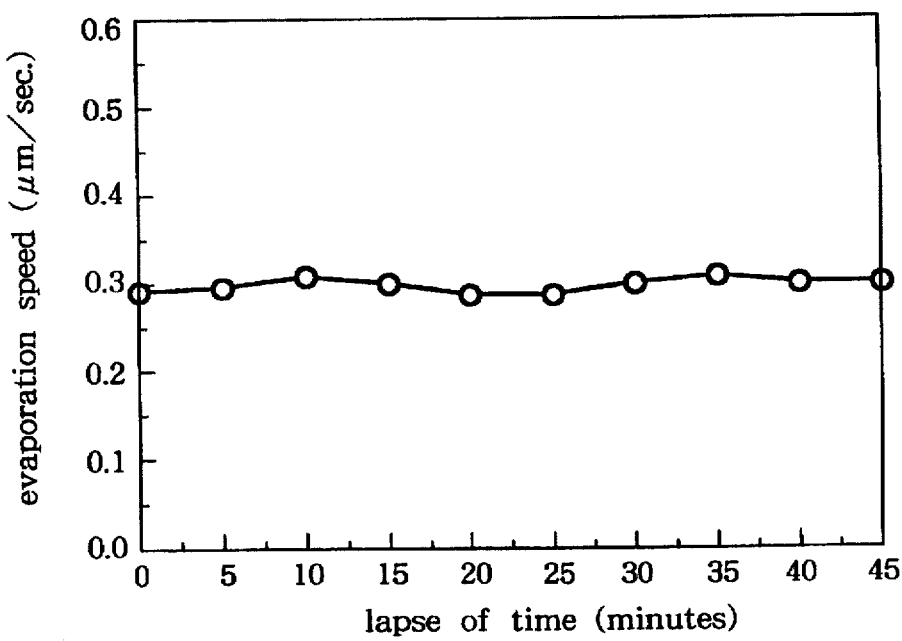
FIG. 8 is a graph showing the change of evaporation speed with the lapse of time in a decompressed $N_2$ atmosphere.

It is noted from FIGS. 7 and 8 that the fluctuations were suppressed small within the deviation of ±6% from the averaged evaporation speed of 0.3 μm/sec. either in the vacuum atmosphere or in the decompressed $N_2$ atmosphere, and that vapor Mg deposition was performed under stabilized conditions. On the other hand, when Mg was evaporated using a crucible having an open upper part, the evaporation speed was widely changed from 0.0001 to 5 μm/sec. so that vapor deposition was unstable.

Example 2

A reflector plate 4 shown in FIG. 2 was provided on the same crucible as that in Example 1. Mg evaporation was performed using this crucible held in a vacuum atmosphere at $1\times10^{-1}$ torr., and the reflector plate 4 was heated to 500° C. or higher. The effect of the reflector plate on the inhibition of clusters or splashes deposited on a substrate sheet was researched under this condition. The results are shown in Table 1.

TABLE 1

EFFECTS OF REFLECTOR PLATE ON
DEPOSITION OF CLUSTERS AND SPLASHES

| TEMP. OF CRUCIBLE (°C.) | DEPOSITION OF CLUSTERS OR SPLASHES ON SUBSTRATE SHEET | |
| --- | --- | --- |
|  | WITH REFLECTOR PLATE | WITHOUT REFLECTOR PLATE |
| 670 | no | no |
| 700 | no | no |
| 750 | no | no |
| 800 | no | do |
| 850 | no | do |
| 900 | no | do |

It is noted from Table 1 that the deposition of clusters or splashes on a substrate sheet was not detected, even when the crucible having the reflector plate was heated to a higher temperature. This effect was caused by the re-evaporation of clusters or splashes which came in contact with the heated reflector plate. When the crucible was held at a temperature below 670° C., Mg evaporation was unstable due to partial solidification.

Example 3

A duct 5 having a rectangular cross section of 35 mm×35 mm was attached to the same crucible as used in Example 1, and a substrate sheet 6 was located at a position 150 mm higher than and separated by 350 mm horizontally from the crucible. The crucible was held in a vacuum atmosphere at $1\times10^{-5}$ torr. or in a decompressed $N_2$ atmosphere at $1\times10^{-1}$ torr., and heated to 700° C. Mg vapor formed in the crucible was carried through the duct 5 heated to 600° C. or higher and deposited on the substrate sheet 6. In this case, a current plate 7 for regulating the stream of Mg vapor was arranged in the duct, to make the vapor deposition uniform over the whole surface of the substrate sheet 6.

Vapor deposition was performed within the deviation of ±10% from the average evaporation speed of 0.5 μm/sec. either in the vacuum atmosphere or in the decompressed $N_2$ atmosphere, and the formed deposition film was uniform in thickness. In this case, Mg vapor was efficiently consumed for the vapor deposition on the substrate sheet, since the duct 5 inhibited the wasteful stream of Mg vapor. Consequently, high deposition speed was obtained. Although the crucible was held at a relatively lower temperature compared with Example 1.

Example 4

Heaters 2 were provided at the upper, lower and side parts of a steel vessel 1 (shown in FIG. 6) of 500 mm in inner diameter having an opening 8, so as to uniformly heat the vessel 1. After a Mg source with purity of 99.9% was received in the vessel 1, the vessel 1 was preset in a vacuum atmosphere containing $N_2$. The vacuum atmosphere was conditioned to a proper degree of vacuum by controlling the inflow amount of $N_2$ and the evacuation speed of a vacuum pump. In this Example, the $H_2O$ partial pressure of the vacuum atmosphere was adjusted to $5 \times 10^{-3}$ torr. by the controlled evacuating power of the vacuum pump. Mg vapor pressure was conditioned by changing the temperature of the vessel 1. Mg evaporation was continued under these conditions.

The area of the opening 8 was variously changed by exchanging the upper wall 11 of the vessel 1 and the sliding motion of a shutter 12, to research the effect of the opening area on Mg evaporation. In addition, the shutter 12 was abruptly opened or closed, to research the effects of the movement of the shutter 12 on Mg evaporation and the degree of vacuum.

The effects of operational conditions such as the opening area of the vessel 1, the exchange of the upper wall 11, the sliding motion of the shutter 12, Mg vapor pressure and the degree of vacuum on the formation of oxide films on the surface of the Mg source and the formation of splashes are shown in Table 2 (the cases according to the present invention) and Table 3 (comparative cases). Tables 2 and 3 show the influences of the abrupt opening motion of the shutter 12 on the state of the Mg source, too.

TABLE 2

EFFECTS OF AREAS OF OPENING AND EVAPORATION SURAFACE OF EVAPORATION BATH ON FORMATION OF SPLASHES AND CONDITION OF Mg (THE PRESENT INVENTION)

| AREA RATIO OF OPENING TO EVAPORATION SURFACE | Mg VAPOR PRES- SURE (torr.) | TEMP. (°C.) OF Mg IN EVAPORA- TION BATH | DEGREE OF VA- CUUM (torr.) | $0.6 \times \frac{\text{Mg VAPOR PRESSURE}}{(\text{DEGREE OF VACUUM})^3}$ | $0.04 \times$ Mg VAPOR PRES- SURE | FORMATION OF OXIDE FILM | FORMATION OF SPLASHES | CONDITION OF Mg IN EVAPORATION BATH WHEN SHUTTER WAS ABRUPTLY OPENED |
|---|---|---|---|---|---|---|---|---|
| 0.002 | 7.2 | 700 | 5.0 | 0.035 | 0.288 | no | no | melted |
| 0.010 | 7.2 | 700 | 5.0 | 0.035 | 0.288 | no | no | melted |
| 0.026 | 7.2 | 700 | 5.0 | 0.035 | 0.288 | no | no | melted |
| 0.032 | 7.2 | 700 | 5.0 | 0.035 | 0.288 | no | no | melted |
| 0.010 | 7.2 | 700 | 3.0 | 0.160 | 0.288 | no | no | melted |
| 0.152 | 7.2 | 700 | 3.0 | 0.160 | 0.288 | no | no | melted |
| 0.160 | 7.2 | 700 | 2.0 | 0.540 | 0.288 | no | no | melted |
| 0.250 | 7.2 | 700 | 2.0 | 0.540 | 0.288 | no | no | melted |
| 0.250 | 7.2 | 700 | 1.0 | >1* | 0.288 | no | no | melted |
| 0.010 | 7.2 | 700 | 0.05 | >1* | 0.288 | no | no | melted |
| 0.270 | 7.2 | 700 | 0.05 | >1* | 0.288 | no | no | melted |
| 0.010 | 17.2 | 750 | 9.0 | 0.014 | 0.680 | no | no | melted |
| 0.040 | 17.0 | 750 | 5.0 | 0.082 | 0.680 | no | no | melted |
| 0.078 | 17.0 | 750 | 5.0 | 0.082 | 0.680 | no | no | melted |
| 0.010 | 5.0 | 680 | 3.5 | 0.070 | 0.200 | no | no | melted |
| 0.194 | 5.0 | 680 | 1.5 | 0.889 | 0.200 | no | no | melted |
| 0.194 | 5.0 | 680 | 0.05 | >1* | 0.200 | no | no | melted |
| 0.026 | 5.0 | 680 | 0.01 | >1* | 0.200 | no | no | melted |

NOTE: The mark (*) represented as ">1" means the area ratio of the opening to the evaporation surface of the evaporation bath being not more than 1.

TABLE 3

EFFECTS OF AREAS OF OPENING AND EVAPORATION SURFACE OF EVAPORATION BATH ON FORMATION OF SPLASHES AND CONDITION OF Mg (COMPARATIVE EXAMPLE)

| AREA RATIO OF OPENING TO EVAPORATION SURFACE | Mg VAPOR PRES- SURE (torr.) | TEMP. (°C.) OF Mg IN EVAPORA- TION BATH | DEGREE OF VA- CUUM (torr.) | $0.6 \times \frac{\text{Mg VAPOR PRESSURE}}{(\text{DEGREE OF VACUUM})^3}$ | $0.04 \times$ Mg VAPOR PRES- SURE | FORMATION OF OXIDE FILM | FORMATION OF SPLASHES | CONDITION OF Mg IN EVAPORATION BATH WHEN SHUTTER WAS ABRUPTLY OPENED |
|---|---|---|---|---|---|---|---|---|
| 0.048 | 7.2 | 700 | 5.0 | 0.035 | 0.288 | do | do | melted |
| 0.090 | 7.2 | 700 | 5.0 | 0.035 | 0.288 | do | do | melted |
| 0.250 | 7.2 | 700 | 5.0 | 0.035 | 0.288 | do | do | melted |
| 0.360 | 7.2 | 700 | 5.0 | 0.035 | 0.288 | do | do | unmelted |
| 0.548 | 7.2 | 700 | 5.0 | 0.035 | 0.288 | do | do | unmelted |
| 0.176 | 7.2 | 700 | 3.0 | 0.160 | 0.288 | do | do | melted |
| 0.336 | 7.2 | 700 | 1.0 | >1* | 0.288 | no | no | unmelted |
| 0.313 | 7.2 | 700 | 0.05 | >1* | 0.288 | no | no | unmelted |
| 0.020 | 17.0 | 750 | 9.0 | 0.014 | 0.680 | do | do | melted |
| 0.102 | 17.0 | 750 | 5.0 | 0.082 | 0.680 | do | do | melted |
| 0.090 | 5.0 | 680 | 3.5 | 0.070 | 0.200 | do | no | melted |
| 0.250 | 5.0 | 680 | 1.5 | 0.889 | 0.200 | no | no | unmelted |
| 0.250 | 5.0 | 680 | 0.05 | >1* | 0.200 | no | no | unmelted |

NOTE: The mark (*) represented as ">1" means the area ratio of the opening to the evaporation surface of the evaporation bath being not more than 1.

It is noted from Tables 2 that Mg was evaporated from a molten state, without the formation of oxide films or splashes, when the operational conditions satisfied the relationships of $W_1/W_2<0.6\times(P_{Mg}/V^3)$ and $W_1/W_2<0.04\times P_{Mg}$. On the contrary, when either one of $W_1/W_2<0.8\times(P_{Mg}/V^3)$ and $W_1/W_2<0.04\times P_{Mg}$ was not satisfied, the formation of oxide films or splashes or the solidification of Mg was detected as shown in Table 3. This comparison means that the conditions of $W_1/W_2<0.6\times(P_{Mg}/V^3)$ and $W_1/W_2<0.04\times P_{Mg}$ are important factors to stabilize Mg evaporation.

Example 5

The area ratio of the opening 8 to the evaporation surface of the Mg source 3 was adjusted to 0.01, and the degree of vacuum was adjusted to 0.01 torr. so as to evaporate Mg without the formation of oxide films. The other conditions were the same as those in Example 4.

In this example, the splashing of the Mg source was researched in relation with the temperature of the Mg source. The results are shown in Table 4. It is noted from Table 4 that splashing was not detected when the molten Mg source was held at a temperature of 770° C. or lower. Violent splashing was detected with the rising of the temperature above 770° C. The splashes were larger in size with the rising of the temperature, too.

TABLE 4

EFFECT OF TEMPERATURE OF MOLTEN Mg SOURCE ON SPLASHING

| NOTE | TEMP. (°C.) OF MOLTEN Mg SOURCE | SPLASHING |
|---|---|---|
| EXAMPLES | 670 | no |
| OF THE | 680 | no |
| PRESENT | 700 | no |
| INVENTION | 720 | no |
|  | 740 | no |
|  | 760 | no |
|  | 770 | no |
| COMPARATIVE | 790 | do |
| EXAMPLES | 810 | do |
|  | 830 | do |

According to the present invention as afore-mentioned, Mg is evaporated from a molten state so that vapor Mg deposition can be performed under stabilized conditions without fluctuations in evaporation speed. The clusters or splashes which would cause defects in vapor deposition films are suppressed by providing a reflector plate at a Mg receiving vessel or a duct extending from the vessel to the surface of a substrate sheet. Since the duct directly introduces Mg vapor toward the substrate sheet and eliminates the wasteful stream of Mg vapor, Mg vapor is efficiently consumed for vapor deposition, and the position to locate the substrate sheet is determined with a high degree of freedom. When the opening area of the vessel is adjusted in relation with other operational conditions, such as the evaporation surface of the Mg source, vapor pressure and the degree of vacuum, the stabilized evaporation of Mg from a molten state is assured without the formation of oxide films or reaction products on the surface of the Mg source or the formation of splashes. Accordingly, vapor Mg deposition is performed under stable conditions without fluctuations in evaporation speed.

What is claimed is:

1. A Mg evaporation method comprising the steps of:

placing a Mg source in an evaporation vessel having an opening, placing the evaporation vessel in at least one of a vacuum atmosphere and a decompressed $N_2$ atmosphere such that the relationships of $W_1/W_2(0.6\times(P_{Mg}/V^3)$ and $W_1/W_2(0.04\times P_{Mg}$ are satisfied, wherein $W_1$ represents the area (mm$^2$) of the opening, $W_2$ represents the evaporation surface area (mm$^2$) of the Mg source, $P_{Mg}$ represents the Mg vapor pressure (torr.) and V represents the degree of vacuum (torr.), heating said vessel so as to fill said vessel with Mg vapor, effusing the Mg vapor through said opening, and directing the Mg vapor to a substrate sheet.

2. A Mg evaporation method comprising the steps of:

placing a Mg source in a vessel having an opening;

heating said vessel to a temperature of at least about 670° C. to form Mg vapor at a pressure sufficient to hold the Mg source in a molten state;

controlling evaporation of the Mg source such that the relationships of $W_1/W_2(0.6\times(P_{Mg}/V^3)$ and $W_1/W_2(0.04\times P_{Mg}$ are satisfied, wherein $W_1$ is the area (mm$^2$) of the opening, $W_2$ is the evaporation surface area (mm$^2$) of the Mg source, $P_{Mg}$ is the Mg vapor pressure (torr.) and V is the mount of vacuum (torr.):

effusing the Mg vapor through the opening; and depositing the Mg vapor on a substrate sheet.

* * * * *

UNITED STATES PATENT AND TRADEMARK OFFICE
CERTIFICATE OF CORRECTION

PATENT NO. : 5,705,226
DATED : January 6, 1998
INVENTOR(S) : Yasushi Fukui, Tadaaki Miono, Minoru Saito It is certified that error appears in the above-identified patent and that said Letters Patent is hereby corrected as shown below:

Column 9 Line 1 "Tables 2" should read --Table 2--.

Column 9 Line 5 "<0.8" should read --<0.6--.

Claim 1 Column 10 Line 23 "(0.6" should read --<0.6--.

Claim 1 Column 10 Line 24 "(0.04" should read --<0.04--.

Claim 2 Column 10 Line 39 "(0.6" should read --<0.6--.

Claim 2 Column 10 Line 40 "(0.04" should read --<0.04--.

Signed and Sealed this

Ninth Day of June, 1998

BRUCE LEHMAN

Attest:

Attesting Officer

Commissioner of Patents and Trademarks